United States Patent [19]

Tatsumi

[11] Patent Number: 5,362,361
[45] Date of Patent: Nov. 8, 1994

[54] DRY ETCHING METHOD

[75] Inventor: Tetsuya Tatsumi, Kanagawa, Japan

[73] Assignee: Sony Corporation, Tokyo, Japan

[21] Appl. No.: 874,111

[22] Filed: Apr. 24, 1992

[30] Foreign Application Priority Data

Apr. 27, 1991 [JP] Japan .................. 3-125465

[51] Int. Cl.⁵ .......................................... H01L 21/00
[52] U.S. Cl. ........................ 156/662; 156/643; 156/646; 156/345
[58] Field of Search ............. 156/643, 646, 662, 345

[56] References Cited

U.S. PATENT DOCUMENTS

| | | | |
|---|---|---|---|
| 4,430,547 | 2/1989 | Yoneda et al. | 156/643 |
| 4,842,683 | 6/1989 | Cheng et al. | 156/643 |
| 4,911,812 | 3/1990 | Kudo et al. | 156/643 |
| 4,943,344 | 7/1990 | Tachi et al. | 156/643 |
| 5,085,750 | 2/1992 | Soraoka et al. | 156/646 |
| 5,147,500 | 9/1992 | Tachi et al. | 156/643 |

FOREIGN PATENT DOCUMENTS

63-181430 7/1988 Japan .

OTHER PUBLICATIONS

"D.C. Plasma Etching of Silicon by Sulfur Hexafluoride Mass Spectrometric Study of Gas Discharge Products"; Plasma Chem. Plasma Proc. 1(2); 201-15; 1981; Wagner et al.; (Abstract only).

*Primary Examiner*—R. Bruce Breneman
*Assistant Examiner*—George Goudreau
*Attorney, Agent, or Firm*—Hill, Steadman & Simpson

[57] ABSTRACT

A dry etching method for anisotropic etching of target material layers at low temperature without using CFC-based gases whereby excessive sidewall protection effects are inhibited and etching reproducibility is improved. In dry etching using $S_2F_2$, sidewalls are protected by depositing sulfur (S) dissociated in plasma on the sidewalls. However, the sulfur thus formed will also deposit on the inside wall of an etching chamber, increasing with time the S/F ratio of an etching reaction system. To prevent this, a first heater is used to heat the lower inside wall of a bell jar of an magnetically-enhanced microwave plasma etching apparatus during etching. Then, a second heater and a third heater are used to heat the outer periphery of a wafer supporting electrode and the exposed portion of a cooling pipe, respectively, so that the atmosphere in the bell jar is kept clean with an appropriate S/F ratio. Thus, the present invention uses sulfur deposition to allow highly reproducible etching of Si-based material layers, silicon compound material layers, and aluminum-based material layers.

8 Claims, 1 Drawing Sheet

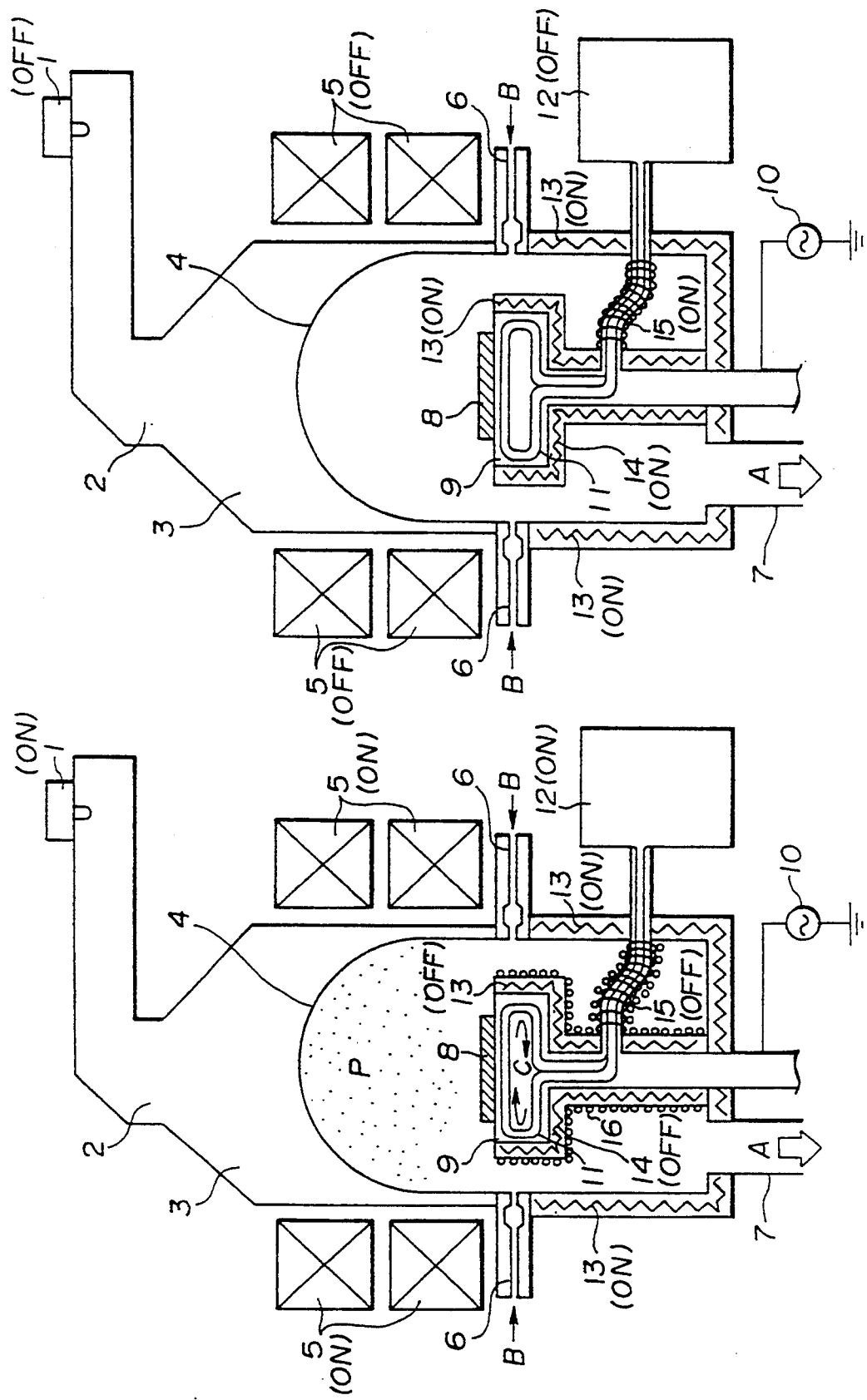

DRY ETCHING METHOD

BACKGROUND OF THE INVENTION

1. Field of the Invention

The present invention relates to a dry etching method employed in such applications as production of semiconductor devices. More particularly, it relates to a dry etching method whereby sulfur may be prevented from accumulating in an etching chamber to improve etching reproducibility in a sidewall protection process using sulfur deposition.

2. Description of the Related Art

The recent trend toward higher integration and performance of such semiconductor devices as VLSIs and ULSIs requires dry etching technologies to achieve correspondingly higher anisotropy, higher etchrate, higher selectivity, lower pollution, and less damage with no compromise in these requirements.

Conventionally, CFC (chlorofluorocarbon) gases typified by CFC 113 ($C_2Cl_3F$) or mixed gas of CFC 113 and $SF_6$ with $SF_6$ added to improve etchrate have been widely used to etch layers of material based on such silicons (Si) as single crystal silicon, polysilicon, refractory metal silicide, and polycide. Particularly, CFC-based gases, whose molecule contains F and Cl, allow etching using both a radical reaction and an ion-assisted reaction and sidewall protection using carbonaceous polymers deposited from the gaseous phase.

Meanwhile, $CHF_3$ gas, mixed gas of $CF_4$ and $H_2$, mixed gas of $C_2F_6$ and $CHF_3$, and $C_3F_8$ have been typically used to etch silicon oxide ($SiO_2$)-based material layers. The common functions of these gases include: (a) forming a C—O bond from a constituent element C on the surface of a $SiO_2$ layer and dissociating or weakening an Si—O bond, (b) forming $CF_x^+$ as an etchant for $SiO_2$, and (c) generating relatively carbon-rich plasma and thereby removing oxygen from the $SiO_2$ in the form of CO or $CO_2$ while reducing the etchrate through carbonaceous polymers deposited on the Si and thereby achieving high selectivity for the Si.

However, CFC-based gases are commonly known to contribute to destruction of the earth's ozone layer and the production and use thereof are likely to be prohibited in the near future. In these circumstances, there is pressing need to find some appropriate substitutes for CFC-based gases for use in dry etching and establish the efficient application methods thereof.

Fluorocarbon-based gases, which are also used to etch $SiO_2$-based material layers, are not categorized as CFC at present but the use thereof will be restricted in the future.

In any case, the future trend toward more strict design rules for semiconductor devices may permit carbonaceous polymers deposited from the gaseous phase to become particle pollutants. In this light, too, there is pressing need to establish CFC-free etching methods.

One promising CFC-free etching method is low temperature etching, in which a radical reaction on a pattern sidewall is frozen or inhibited to avoid such etching defects as undercut with a target substrate (wafer) maintained at a temperature of 0° C. or less and the vertical etchrate kept at a practical level through an ion-assisted reaction. The low temperature etching is publicized in e.g. the Extended Abstract of the 35th Spring Meeting (1988) of the Japan Society of Applied Physics and Related Societies, p.495, 28a-G-2. In this instance, a silicon trench and a $n^+$ type polysilicon layer are etched with a wafer cooled to −130° C.

However, the low temperature etching, which attempts to achieve high anisotropy only by freezing or inhibiting a radical reaction, requires considerably low temperature and may considerably reduce both economy and throughput. A more practical etching method might be to combine radical reaction inhibition with sidewall protection in low temperature to perform etching in a temperature zone close to room temperature.

The present inventor has proposed a great number of sidewall protection methods using sulfur deposition. Sulfur (S) will be deposited by etching gas when the gas is composed mainly of sulfur halides with a relatively high S/X ratio, i.e. the ratio of the number of sulfur (X) atoms to that of halogen (X) atoms.

For instance, such sulfur fluorides as $S_2F_2$, $SF_2$, $SF_4$, and $S_2F_{10}$ will form sulfur in the gaseous phase from dissociation thereof through electric discharge unlike more well-known sulfur fluoride $SF_6$. When a substrate is cooled to low temperature, the sulfur thus formed will deposit on the surface thereof, producing sidewall protection effects. When the substrate is heated after completion of etching, the sulfur deposits will sublime immediately, avoiding the danger of inducing particle pollution. Noting that the above mentioned sulfur halides form a smaller amount of sulfur radical (F*) than $SF_6$ and that $SF_x^+$ serves for an ion assisted reaction, the present inventor has proposed a method of applying these sulfur halides to etch $SiO_2$-based material layers to achieve high selectivity for Si underlying layer.

Thus, the present assignee has first proposed sulfur fluoride with a relatively high S/F ratio as a sulfur halide for etching $SiO_2$-based material layers. Further, the present assignee has later proposed various methods of applying sulfur halides to etch Si-based material layers.

An example of such etching methods is to etch Si-based material layers by using gas containing such sulfur chlorides as $S_2Cl_2$ or such sulfur bromides as $S_2Br_2$ with a target substrate cooled to 0° C. or less. This etching method aims at reducing the effects of radicals and achieving higher anisotropy by using gas unlikely to form highly reactive F*.

The above mentioned etching method using sulfur halides is an epoch-making CFC-free etching method in that it allows clean anisotropic etching in practical temperature zones. However, the subsequent study by the present assignee has shown that practical application of the etching method requires more strict control over the S/X ratio of an etching reaction system.

In the above mentioned etching method, sulfur formed in the gaseous phase is used for sidewall protection and deposits on the inside wall of an etching chamber and the surface of various members. It has proved, however, that the sulfur thus formed will continue to deposit in a single-slice etching apparatus not at a constant rate but at widely varying rates depending on whether the number of etched wafers is large or small. Therefore, the S/X ratio of the etching reaction system will vary slightly with the number of etched wafers and then increase sharply under the strong influence of sulfur deposited on other members than the wafers when the deposition rate of the sulfur reaches an almost saturated point. In this event, the sulfur will deposit excessively on the wafers and cause such problems as pattern tapering and etchrate reduction.

Object and Summary of the Invention

It is therefore an object of the present invention to provide a dry etching method whereby the S/X ratio of an etching reaction system may be prevented from increasing to allow highly reproducible anisotropic etching on the principle of applying sulfur to sidewall protection.

The present invention is intended to heat those portions of an etching chamber which may carry sulfur deposits and thereby reduce the deposition rate thereof in order to prevent the S/X ratio of an etching reaction system from increasing with time.

In one aspect of the present invention, etching is performed by heating at least one portion of the wall of the etching chamber to higher temperature than room temperature. In this event, sulfur formed in plasma from dissociation of sulfur halides through electric discharge will deposit on the surface of a target substrate (wafer) maintained at a lower temperature than room temperature and the surrounding members thereof but not accumulate on the inside wall of the etching chamber because the sulfur will sublime immediately after reaching the heated wall.

In another aspect of the present invention, an etching process is separated from a cleaning process. In the etching process, sulfur halides are used to etch the material layers. To this end, target substrates (wafers) are maintained at a lower temperature than room temperature usually by circulating appropriate refrigerant through cooling pipes buried in the wafer supporting electrodes. As a natural consequence, the surface of the wafer supporting electrode and the pipes for introducing refrigerant into the etching apparatus are cooled to a lower temperature than room temperature, so that sulfur will deposit on these cooled members. In the cleaning process, therefore, those members which carry sulfur deposits are heated to a higher temperature than room temperature in order to sublime them.

The etching process may be combined with the cleaning process if those members which are likely to carry sulfur deposits are heated to a higher temperature than room temperature during etching. However, this approach attempts to cool and heat such members simultaneously and contradicts the principle of low temperature etching. In the second aspect of the present invention, therefore, the etching process is separated from the cleaning process.

In still another aspect of the present invention, the wall of the etching chamber is heated in both the etching process and the cleaning process, thereby preventing sulfur from accumulating on both the inside wall of the etching chamber and the cooled members and consequently excessive increase in the S/X ratio in the etching reaction system. In this event, the wall of the etching chamber is heated throughout the two processes, so that sulfur is prevented not only from depositing in the etching process but also from adhering again to the inside wall of the etching chamber in the cleaning process when the sulfur is released from the surface of the cooled members into the gaseous phase.

According to the present invention, the S/X ratio of the etching reaction system can be regulated easily by turning on and off heating means without changing the composition of the etching gas and controlling the flow rate thereof. Accordingly, highly reproducible etching can be performed quite easily.

As is clear from the foregoing description, the present invention provides a promising CFC-free etching method, which is highly useful in production of semiconductor devices.

BRIEF DESCRIPTION OF THE DRAWINGS

FIGS. 1a and 1b are schematic cross-sectional views showing one typical construction and application of a magnetically-enhanced microwave plasma etching apparatus as used in an etching process and a cleaning process, respectively.

DETAILED DESCRIPTION OF THE INVENTION

The following paragraphs describe non-limitative preferred embodiment of the present invention.

Referring first to FIGS. 1a and 1b, there is illustrated the construction and operation of an RF biased magnetically-enhanced microwave plasma etching apparatus used in one preferred embodiment of the present invention.

The illustrated etching apparatus comprises a magnetron 1 for generating a microwave with a frequency of 2.45 GHz, a rectangular waveguide 2 and a circular waveguide 3 for guiding the microwave, a quartz bell jar 4 for generating ECR plasma P internally through ECR discharge using the microwave, a solenoid coil 5 adapted for circling around the circular waveguide 3 and the bell jar 4 and capable of producing a magnetic flux density of 875 gausses, a gas feed tube 6 for feeding etching gas to the bell jar 4 from the direction of arrow B in the drawings, a wafer supporting electrode 9 for supporting a wafer 8, and an RF power source 10 for applying an RF bias to the wafer supporting electrode 9. The bell jar 4 is evacuated under a high vacuum via an air outlet 7 by a vacuum system (not shown).

Besides the above mentioned major members, the etching apparatus for use in the present invention is further provided with mechanisms for allowing low temperature etching, preventing sulfur from depositing on the inside wall of the etching chamber, and removing sulfur from the surface of the cooled members in the cleaning process.

Referring more particularly to the drawings, the bell jar 4 is provided on the bottom face thereof and the inner sidewall thereof below the gas feed tube 6 with first heaters 13 for preventing sulfur from depositing on the bottom face and the inner sidewall during etching. It is to be understood that the first heaters 13 may be provided on any other position than illustrated in the drawings and omitted particularly from those upper portions of the bell jar 4 which are heated sufficiently by radiation of the ECR plasma P.

In the wafer supporting electrode 9 is buried a cooling pipe 11 for allowing low temperature etching. The cooling pipe 11 is designed to take in refrigerant fed from a cooling facility 12 externally provided and circulate the refrigerant in the direction of arrow C in the drawings. Any commercially available cooling facility may serve as the cooling facility 12. According to the present invention, however, etching temperature need not be so low as liquid nitrogen because the present invention is intended to allow anisotropic etching in a practical temperature zone along with sidewall protection. In the illustrated embodiment of the present invention, therefore, a relatively low-priced small-size chiller is used as the cooling facility 12.

The wafer supporting electrode 9 is provided on the surface thereof with a second heater 14 for subliming sulfur 16 depositing on the surface during etching.

The cooling pipe 11 is further wound on the portions thereof exposed in the bell jar 4 with a third heater 15 formed mainly of heating wires. In the illustrated embodiment of the present invention, the third heater 15 is flexible because the cooling pipe 11 is usually formed of such flexible material as flexible SUS steel. However, the third heater 15 may have any other property than illustrated in the drawings.

It is preferred that the heaters 13, 14, and 15 should be capable of heating the inside wall of the bell jar 4, the wafer supporting electrode 9, and the exposed portions of the cooling pipe 11, respectively, to a higher temperature than room temperature, preferably, 50° C. or more.

The following paragraphs describe the operation of the above etching apparatus used in one preferred embodiment of the present invention.

Referring now to FIG. 1a, in the etching process, the first heaters 13 are turned ON to heat the lower inside wall of the bell jar 4 while refrigerant is fed from the cooling facility 12 via the cooling pipe 11 to cool the wafer supporting electrode 9. At this time, the second heater 14 and the third heater 15 are kept OFF to prevent reduction of cooling efficiency. Etching gas composed mainly of sulfur halide is fed from the gas feed tube 6 into the bell jar 4 while the magnetron 1 and the solenoid coil 5 are turned ON to form the ECR plasma P by the ECR discharge and thereby etch a target material layer on the wafer 8. Then, sulfur 16 will deposit on the surface of the wafer supporting electrode 9, the exposed portions of the cooling pipe 11, the third heater 15, and other members.

Referring then to FIG. 1b, in the cleaning process, the second heater 14 and the third heater 15 are turned ON after stopping the feeding of the etching gas, the ECR discharge, and the feeding of the refrigerant from the cooling facility 12. Then, the sulfur 16 depositing in the etching process will sublime.

By repeating the etching process and the cleaning process alternately, the atmosphere in the bell jar 4 will be kept clean. Accordingly, a highly reproducible single-slice etching can be performed without varying the S/X ratio of etching system.

Preferred Embodiment

The following paragraphs describe a non-limitative preferred example of the present invention using the above mentioned RF biased magnetically-enhanced microwave plasma etching apparatus.

In this example, $S_2F_2$ is used as the etching gas for processing polysilicon gate electrodes.

On a single crystal silicon substrate was formed a polysilicon layer containing $n^+$ type impurities via a $SiO_2$ gate insulation film and provided a wafer 8 with a resist mask patterned to a predetermined shape thereon. The wafer 8 was set on the wafer supporting electrode 9 and cooled to 0° C. by ethanol refrigerant as shown in FIG. 1a. The first heaters 13 were turned ON to heat the lower inside wall of the bell jar 4 to approximately 70° C.

In this state, the polysilicon layer was etched, for instance, with a $S_2F_2$ flow rate of 5 SCCM, gas pressure of 1.3 Pa (10 m Torr), microwave power of 850 W, and RF bias power of 50 W (2 MHz).

In the etching process, $F^*$ formed from dissociation of $S_2F_2$ through electric discharge served as a main etchant for the polysilicon layer while sulfur formed in the gaseous phase deposited on the sidewall of the pattern, producing sidewall protection effects. $S_2F_2$ also formed such ions as $S^+$, $SF_x^+$, and $F^+$, which, in turn, assisted a radical reaction to perform high-rated anisotropic etching. As a result, a gate electrode was processed into an excellent anisotropic shape.

At this time, no sulfur deposited on those inside wall portions of the bell jar 4 which were heated by radiation of the ECR plasma P and the first heaters 13 while sulfur 16 deposited on the surface of the wafer supporting electrode 9, the exposed portions of the cooling pipe 11, the third heater 15, and other such members that were cooled along with the wafer 8.

Then, the second heater 14 and the third heater 15 were turned ON to heat the wafer supporting electrode 9 and the cooling pipe 11, respectively, to approximately 70° C. after stopping the feeding of $S_2F_2$, the generation of microwaves, the application of a magnetic field, and the feeding of ethanol refrigerant. By this heating, the sulfur 16 deposits formed in the etching process was sublimed and the atmosphere in the bell jar 4 was kept clean with an appropriate S/F ratio. At the same time, the wafer 8 was also heated to sublime sulfur deposits (not shown) formed on the sidewall of the pattern and producing sidewall protection effects. Thus, the etching method using sulfur halide has a great advantage in that sidewall protection substance induces no particle pollution.

By repeating the etching process and the cleaning process alternately, a highly reproductive single-slice etching could be performed on multiple wafers.

In the above mentioned preferred embodiment, $S_2F_2$ was used as etching gas but may be replaced by any other sulfur halide as the specified by the present invention. According to the present invention, the etching gas may contain various additive gases. For instance, when nitrogen ($N_2$) gas is added to the etching gas, the resulting reaction product can be expected to improve the sidewall protection effects of sulfur deposits. Further, such rare gases as helium (He) and argon (At) can also be added to obtain sputtering, cooling, and diluting effects.

It is to be understood that the present invention is not limited to use in processing polysilicon gate electrodes; it may be applied to polycide gate electrode processing or silicon trench etching by etching any other Si-based material layers, contact hole processing by etching Si-$O_2$-based material layers, and aluminum-based interconnection processing.

In the above mentioned preferred embodiment, a magnetically-enhanced microwave plasma etching apparatus was used as an etching apparatus but may be replaced by a parallel flat plate reactive iron etching (RIE) apparatus or a magnetron RIE apparatus with a similar mechanism.

Also in the above mentioned preferred embodiment, the ECR discharge was stopped in the cleaning process but may be continued with appropriate gas fed while cleaning sulfur deposits along with the ECR plasma, in which case it is preferred to replace the wafer 8 on the wafer supporting electrode 9 with a dummy silicon wafer.

What is claimed is:

1. A dry etching method comprising:

(a) a step of heating at least one portion of the wall of an etching chamber to a higher temperature than room temperature, and (b) a step of cooling a target substrate to a lower temperature than room temperature while plasma etching a target material layer of said target substrate by using etching gas containing at least one compound selected from $S_2F_2$, $SF_2$, $SF_4$, $S_2F_{10}$, $S_3Cl_2$, $S_2Cl_2$, $SCl_2$, $S_3Br_2$, $S_2Br_2$, and $SBr_2$.

2. A dry etching method as claimed in claim 1 wherein said target material layer is composed of any one of single crystal silicon, polysilicon, polycide, and aluminum-based material.

3. A dry etching method comprising:

(a) a first step of cooling a target substrate and a member in an etching chamber to a lower temperature than room temperature while plasma etching a target material layer of said target substrate by using etching gas containing at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$, and $SBr_2$, and (b) a second step of subliming sulfur deposits on said member in the etching chamber by heating said member.

4. A dry etching method as claimed in claim 3 wherein both said first step and said second step are completed by heating at least a part of a sidewall portion of said etching chamber to a higher temperature than room temperature.

5. A dry etching method as claimed in claim 3 wherein said target material layer is composed of any one of single crystal silicon, polysilicon, polycide, and aluminum-based material.

6. A dry etching method as claimed in claim 3 wherein said member in said etching chamber is selected from a wafer supporting electrode and a cooling pipe.

7. A dry etching method comprising providing a plasma etching chamber having a target substrate support provided with cooling means, placing a target substrate on said target substrate support, cooling the target substrate support to cool the target substrate to a temperature lower than room temperature, while heating portions of said etching chamber disposed away from said substrate support, plasma etching a target material layer of the target substrate by using etching gas containing at least one compound selected from the group consisting of $S_2F_2$, $SF_2$, $SF_4$, $S_2F_{10}$, $S_3Cl_2$, $S_2Cl_2$, $SCl_2$, $S_3Br_2$, $S_2Br_2$ and $SBr_2$ so that sulfur deposits occurring during the plasma etching on said heated portions are sublimed during said etching to maintain the ratio of sulfur to halogen substantially constant.

8. A dry etching method according to claim 7, which includes, subsequent to the plasma etching, heating the target substrate support to sublime the sulfur therefrom and from said target substrate.

* * * * *